United States Patent [19]
Takahashi

[11] Patent Number: 5,521,953
[45] Date of Patent: May 28, 1996

[54] SHIFT REGISTER WITH TRANSFER GATE-INVERTER ARRANGEMENT PROVIDING STABLE OPERATION

[75] Inventor: Hiroshi Takahashi, Ohi-machi, Japan

[73] Assignee: Texas Instruments Incorporated, Dallas, Tex.

[21] Appl. No.: 163,240

[22] Filed: Dec. 6, 1993

[51] Int. Cl.$^6$ ................................................ G11C 19/28
[52] U.S. Cl. .................................. 377/68; 377/79; 377/74
[58] Field of Search .................................. 377/68, 74, 79

[56] References Cited

U.S. PATENT DOCUMENTS

| | | | |
|---|---|---|---|
| 3,731,287 | 5/1973 | Seely et al. | 377/68 |
| 4,035,662 | 7/1977 | Kuo | 377/74 |
| 4,495,628 | 1/1985 | Zasio | 377/79 |
| 5,239,206 | 8/1993 | Yanai | 377/79 |

*Primary Examiner*—John S. Heyman
*Attorney, Agent, or Firm*—William E. Hiller; Richard L. Donaldson

[57] ABSTRACT

A shift register which is stably operable even under low power voltage and including a first transfer gate NTM1 connected to a data input terminal DIN1, second and third transfer gates NTM2 and NTM3 connected in series to a ground line, a pair of inverters IVM1 and IVM2 connected in the opposite orientation between the output terminals of the first and third gates, and fourth and fifth transfer gates NTS1 and NTS2 connected in parallel with respect to the outputs of the pair of inverters IVM1 and IVM2. The shift register further includes a pair of inverters IVS1 and IVS2 connected in the opposite orientation between the output terminals of the fourth and fifth gates. The gate terminal of the second gate is connected to the data input terminal, a first clock signal MCLK is input into the gate terminals of the first and third gates, and a second clock signal SCLK, in which the phase differs from the first clock signal, is input into the gate terminals of the fourth and fifth gates.

10 Claims, 8 Drawing Sheets

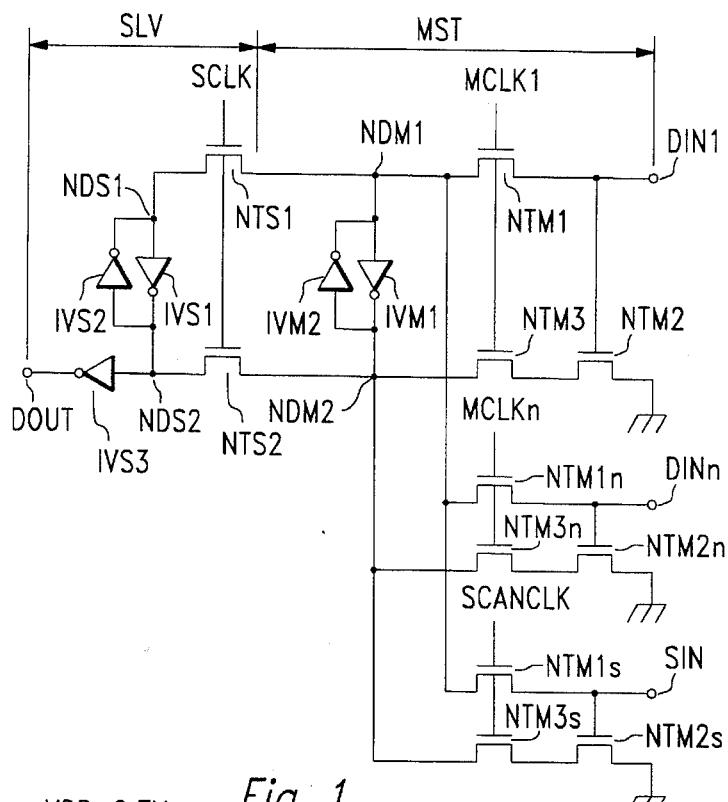

Fig. 1

| | VDD=2.7V | | | | | | | | | |
|---|---|---|---|---|---|---|---|---|---|---|
| | NWPW | | NWPS | | NSPW | | NNPN | | NSPS | |
| TEMPERATURE | L→H | H→L | L→H | H→L | L→H | H→L | L→H | H→L | L→H | H→L |
| 85°C | 2.63ns | 2.39ns | 2.38ns | 2.79ns | 2.69ns | 2.36ns | 2.63ns | 2.39ns | 1.58ns | 1.55ns |

COMPLETE CMOS TYPE SHIFT REGISTER (CONVENTIONAL)

Fig. 2a

| | VDD=2.7V | | | | | | | | | |
|---|---|---|---|---|---|---|---|---|---|---|
| | NWPW | | NWPS | | NSPW | | NNPN | | NSPS | |
| TEMPERATURE | L→H | H→L | L→H | H→L | L→H | H→L | L→H | H→L | L→H | H→L |
| 85°C | 3.37ns | 3.36ns | 3.03ns | 2.99ns | 1.79ns | 2.16ns | 1.83ns | 2.08ns | 1.13ns | 1.40ns |

SHIFT REGISTER OF FIG. 1

Fig. 2b

| | VDD=2.7V | | | | | | | | | |
|---|---|---|---|---|---|---|---|---|---|---|
| | NWPW | | NWPS | | NSPW | | NNPN | | NSPS | |
| TEMPERATURE | L→H | H→L | L→H | H→L | L→H | H→L | L→H | H→L | L→H | H→L |
| 85°C | 3.11ns | 2.82ns | 1.56ns | 1.81ns | 1.68ns | 1.68ns | 1.72ns | 1.68ns | 1.08ns | 1.07ns |

COMPLETE CMOS TYPE SHIFT REGISTER (CONVENTIONAL)

Fig. 3a

| | VDD=2.7V | | | | | | | | | |
|---|---|---|---|---|---|---|---|---|---|---|
| | NWPW | | NWPS | | NSPW | | NNPN | | NSPS | |
| TEMPERATURE | L→H | H→L | L→H | H→L | L→H | H→L | L→H | H→L | L→H | H→L |
| 85°C | 2.20ns | 2.40ns | 2.42ns | 1.80ns | 0.99ns | 1.00ns | 1.23ns | 1.32ns | 0.18ns | 0.87ns |

SHIFT REGISTER OF FIG. 1

Fig. 3b

VDD=2.7V

| TEMPERATURE | NWPW | | NWPS | | NSPW | | NNPN | | NSPS | |
|---|---|---|---|---|---|---|---|---|---|---|
| | L→H | H→L | L→H | H→L | L→H | H→L | L→H | H→L | L→H | H→L |
| 85°C | 39.6uW | 38.3uW | 37.2uW | 39.5uW | 41.0uW | 38.1uW | 39.6uW | 38.3uW | 38.4uW | 38.6uW |

COMPLETE CMOS TYPE SHIFT REGISTER (CONVENTIONAL)

*Fig. 4a*

VDD=2.7V

| TEMPERATURE | NWPW | | NWPS | | NSPW | | NNPN | | NSPS | |
|---|---|---|---|---|---|---|---|---|---|---|
| | L→H | H→L | L→H | H→L | L→H | H→L | L→H | H→L | L→H | H→L |
| 85°C | 38.0uW | 26.4uW | 50.2uW | 33.6uW | 35.5uW | 25.3uW | 36.2uW | 27.1uW | 35.4uW | 28.6uW |

SHIFT REGISTER OF FIG. 1

*Fig. 4b*

VDD=1.5V

| TEMPERATURE | NWPW | | NWPS | | NSPW | | NNPN | | NSPS | |
|---|---|---|---|---|---|---|---|---|---|---|
| | L→H | H→L | L→H | H→L | L→H | H→L | L→H | H→L | L→H | H→L |
| 85°C | 19.1ns | 14.4ns | 14.7ns | 15.2ns | 16.4ns | 9.49ns | 8.24ns | 7.01ns | 4.15ns | 3.92ns |
| 25°C | 21.4ns | 15.1ns | 12.4ns | 12.6ns | ****ns | 8.00ns | 8.62ns | 7.07ns | 4.18ns | 3.84ns |
| -25°C | 24.9ns | 16.2ns | 11.0ns | 10.9ns | ****ns | 12.1ns | 9.14ns | 7.16ns | 4.19ns | 3.75ns |

*Fig. 5a*

VDD=2.7V

| TEMPERATURE | NWPW | | NWPS | | NSPW | | NNPN | | NSPS | |
|---|---|---|---|---|---|---|---|---|---|---|
| | L→H | H→L | L→H | H→L | L→H | H→L | L→H | H→L | L→H | H→L |
| 85°C | 3.37ns | 3.36ns | 3.03ns | 2.99ns | 1.79ns | 2.16ns | 1.83ns | 2.08ns | 1.13ns | 1.40ns |
| 25°C | 3.06ns | 3.04ns | 2.56ns | 2.61ns | 1.73ns | 1.97ns | 1.68ns | 1.89ns | 1.04ns | 1.25ns |
| -25°C | 2.78ns | 2.75ns | 2.19ns | 2.26ns | 1.67ns | 1.80ns | 1.57ns | 1.71ns | 0.97ns | 1.14ns |

*Fig. 5b*

VDD=4.5V

| TEMPERATURE | NWPW | | NWPS | | NSPW | | NNPN | | NSPS | |
|---|---|---|---|---|---|---|---|---|---|---|
| | L→H | H→L | L→H | H→L | L→H | H→L | L→H | H→L | L→H | H→L |
| 85°C | 1.46ns | 1.72ns | 1.31ns | 1.62ns | 0.88ns | 1.10ns | 0.91ns | 1.14ns | 0.62ns | 0.83ns |
| 25°C | 1.30ns | 1.52ns | 1.14ns | 1.39ns | 0.82ns | 0.97ns | 0.82ns | 1.01ns | 0.56ns | 0.73ns |
| -25°C | 1.17ns | 1.33ns | 0.98ns | 1.20ns | 0.77ns | 0.85ns | 0.75ns | 0.88ns | 0.52ns | 0.64ns |

*Fig. 5c*

VDD=1.5V

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 10.6ns | 19.7ns | 10.3ns | 8.89ns | 4.35ns | 13.9ns | 4.39ns | 8.49ns | 2.25ns | 3.93ns |
| 25°C | 11.7ns | 25.2ns | 8.36ns | 8.92ns | ****ns | 13.4ns | 4.50ns | 10.2ns | 2.19ns | 4.37ns |
| -25°C | 18.0ns | 35.0ns | 7.28ns | 8.92ns | ****ns | 25.2ns | 4.65ns | 12.4ns | 2.17ns | 4.89ns |

*Fig. 6a*

VDD=2.7V

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 2.20ns | 2.40ns | 2.42ns | 1.80ns | 0.99ns | 1.00ns | 1.23ns | 1.32ns | 0.18ns | 0.87ns |
| 25°C | 1.95ns | 2.20ns | 1.99ns | 1.63ns | 0.91ns | 0.93ns | 1.12ns | 1.22ns | 0.73ns | 0.82ns |
| -25°C | 1.80ns | 2.04ns | 1.71ns | 1.47ns | 0.84ns | 0.87ns | 1.01ns | 1.13ns | 0.67ns | 0.76ns |

*Fig. 6b*

VDD=4.5V

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 1.18ns | 1.10ns | 1.25ns | 0.99ns | 0.61ns | 0.58ns | 0.76ns | 0.74ns | 0.53ns | 0.54ns |
| 25°C | 1.04ns | 0.98ns | 1.09ns | 0.88ns | 0.54ns | 0.53ns | 0.68ns | 0.67ns | 0.51ns | 0.50ns |
| -25°C | 0.93ns | 0.89ns | 0.98ns | 0.80ns | 0.48ns | 0.48ns | 0.62ns | 0.61ns | 0.46ns | 0.45ns |

*Fig. 6c*

VDD=1.5V  MACHINE CYCLE = 100 nsec

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 4.93uW | 3.56uW | 7.20uW | 6.15uW | 6.66uW | 3.36uW | 4.74uW | 3.63uW | 4.55uW | 3.70uW |
| 25°C | 4.79uW | 3.39uW | 5.99uW | 5.30uW | ****uW | 3.65uW | 4.59uW | 3.48uW | 4.36uW | 3.54uW |
| -25°C | 4.76uW | 3.26uW | 5.29uW | 4.76uW | ****uW | 3.16uW | 4.52uW | 3.36uW | 4.24uW | 3.43uW |

*Fig. 7a*

VDD=2.7V  MACHINE CYCLE = 50 nsec

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 38.0uW | 26.4uW | 50.2uW | 33.6uW | 35.5uW | 25.3uW | 36.2uW | 27.1uW | 35.4uW | 28.6uW |
| 25°C | 36.5uW | 25.6uW | 45.7uW | 32.0uW | 35.3uW | 24.7uW | 34.9uW | 26.2uW | 34.4uW | 27.9uW |
| -25°C | 35.7uW | 24.9uW | 42.6uW | 30.9uW | 35.4uW | 24.4uW | 34.1uW | 25.6uW | 33.8uW | 27.2uW |

*Fig. 7b*

VDD=4.5V  MACHINE CYCLE = 25 nsec

| TEMPERATURE | NWPW L→H | NWPW H→L | NWPS L→H | NWPS H→L | NSPW L→H | NSPW H→L | NNPN L→H | NNPN H→L | NSPS L→H | NSPS H→L |
|---|---|---|---|---|---|---|---|---|---|---|
| 85°C | 251uW | 173uW | 323uW | 218uW | 228uW | 170uW | 245uW | 186uW | 251uW | 204uW |
| 25°C | 245uW | 170uW | 310uW | 212uW | 227uW | 167uW | 242uW | 183uW | 251uW | 202uW |
| -25°C | 242uW | 168uW | 302uW | 210uW | 226uW | 166uW | 241uW | 181uW | 251uW | 203uW |

*Fig. 7c*

| CIRCUIT TYPE | CELL SIZE | AREA RATIO |
|---|---|---|
| COMPLETE CMOS TYPE SHIFT REGISTER (CONVENTIONAL) | 63.6 μm×36.0 μm | 1.0 |
| SHIFT REGISTER (FIGURE 8) | 49.2 μm×36.0 μm | 0.78 |
| SHIFT REGISTER (FIGURE 1) | 45.2 μm×36.0 μm | 0.71 |

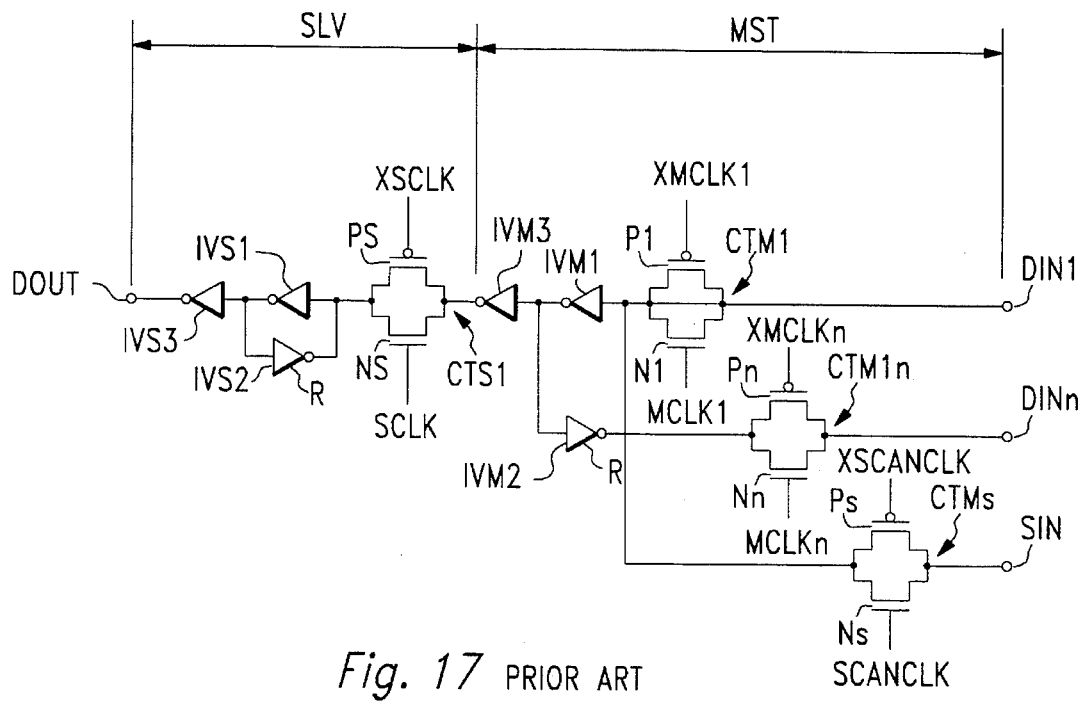
Fig. 17 PRIOR ART
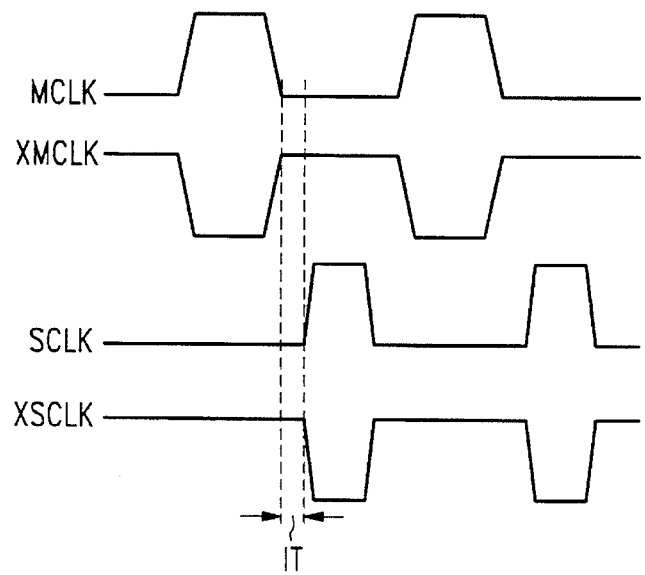
Fig. 18a PRIOR ART
Fig. 18b PRIOR ART
Fig. 18c PRIOR ART
Fig. 18d PRIOR ART

SHIFT REGISTER WITH TRANSFER GATE-INVERTER ARRANGEMENT PROVIDING STABLE OPERATION This invention pertains to a shift register constituted by using MIS (Metal Insulation Semiconductor) transistors.

BACKGROUND OF THE INVENTION

FIG. 15 is a circuit diagram showing the basic configuration of a conventional shift register operable with power voltage $V_{DD}$=5.0 V.

In FIG. 15, MST is the master latch, SLV is the slave latch, NTM1, NTM1n, NTMs, and NTS1 are transfer gates composed of n-channel MOS transistors with threshold value voltage $V_{thN}$ of about 1 V, IVM1, IVM2, IVM3, IVS1, IVS2, and IVS3 are inverters, DIN1, DINn, and SIN are data input terminals, and DOUT is the data output terminal.

Master latch MST is comprised of transfer gates NTM1, NTM1n, NTMs, and inverters IVM1, IVM2, IVM3.

Specific connections are that each input terminal of transfer gates NTM1, NTM1n, and NTMs is connected respectively to data input terminals DIN1, DINn, and SIN, and each output terminal of transfer gates NTM1, NTM1n, and NTMs is connected to the input terminal of inverter IVM1 and output terminal of inverter IVM2.

Also, the output terminal of inverter IVM1 is connected to the input terminals of inverters IVM2 and IVM3, and the output terminal of inverter IVM2 is connected to the input terminal of inverter IVM1.

Namely, inverters IVM1 and IVM2 are connected between the input terminal of inverter IVM3 and output terminal of each transfer gates NTM1, NTM1n, and NTMs in parallel with the input/output terminals in the opposite orientation.

Inverter IVM2 is constituted with a high-resistance type inverter for safe operation of the circuit and prevention of through current.

Slave latch SLV is comprised of transfer gate NTS1 and inverters IVS1, IVS2, and IVS3.

The specific connections are that the input terminal of transfer gate NTS1 is connected to the output terminal of inverter IVM3 in master latch MST, and the output terminal is connected to the input terminal of inverter IVS1 and output terminal of inverter IVS2.

Also, the output terminal of inverter IVS1 is connected to the input terminals of inverters IVS2 and IVS3, and the output terminal of inverter IVS2 is connected to the input terminal of inverter IVS1.

Namely, inverters IVS1 and IVS2 are connected between the input terminal of inverter IVS3 and the output terminal of transfer gate NTS1 in parallel with the input/output terminals in the opposite orientation.

Inverter IVS2 is comprised of a high-resistance inverter for safe operation of the circuit and prevention of through current.

Also, each gate terminal of each transfer gate NTM1, NTM1n, NTMs and NTS1 is connected respectively to the control system through the signal line, not shown in the figure, and prescribed level in which the timing is controlled by said control system, for example, clock signals of 5 V are input.

Specifically, clock signal MCLK1 is input into the gate terminal of transfer gate NTM1, and clock signal MCLKn is input into the gate terminal of transfer gate NTM1n. Said first clock signals (1,n) do not become high level at the same time.

Also, scan clock signal SCANCLK for device test is input into the gate terminal of transfer gate NTMs.

On the other hand, clock signal SCLK in which the phase differs from clock signal MCLK (1,n) is input into the gate terminal of transfer gate NTS1.

FIGS. 16a and 16b are timing charts showing the relationship between clock signal MCLK and clock signal SCLK.

As shown in FIGS. 16a and 16b, clock signal MCLK and clock signal SCLK are out of phase by 180°, and so-called isolation time IT is provided in which both signals become low level in order to prevent clock skew.

Therefore, input of the clock signals is controlled so that when transfer gate NTM1 or NTM1n of master latch MST is in the ON state, transfer gate NTS1 of slave latch SLV maintains the OFF state, and when transfer gate NTS1 of slave latch SLV is in the ON state, transfer gate NTM1 or NTMn of master latch MST maintains the OFF state.

Transfer gate NTMs for scanning is provided for testing of the device and scan clock SCANCLK input into the gate terminal of said transfer gate NTMs is input with the same timing as clock signal MCLK.

Namely, the input of the clock signals is controlled during the device test so that when transfer gate NTMs for scanning is in the ON state, transfer gate NTS1 of slave latch SLV maintains the OFF state, and when transfer gate NTS1 of slave latch SLV is in the ON state, transfer gate NTMs for scanning maintains the OFF state.

Here, the operation of a case when data in high level "1" of 5 V is input into input terminal DIN1 will be explained in the constitution of FIG. 15.

When data at high level "1" of 5 V is input into input terminal DIN1, transfer gate NTM1 takes on the ON state if clock signal MCLK1 is input into the gate terminal of transfer gate NTM1 at high level of 5 V.

By it, the input data of high level 5 V passes through transfer gate NTM1 but at this time, level at output terminal side node ND1 of transfer gate NTM1 becomes about 3.5 V due to the substrate effect and threshold value voltage $V_{thN}$ (about 1 V) of transfer gate NTM1, and this level is applied to the input terminal of inverter IVM1.

The circuit threshold value of inverter IVM1 is generally set at about ½ of power voltage $V_{DD}$ or a level slightly lower than that so the output side becomes a low level due to the level inversion function of inverter IVM1. At this time, the input level is 3.5 V which is lower than 5 V so some through current flows.

Low level which is the output of inverter IVM1 is applied to the input terminal of inverter IVM2 and inverter IVM3.

Inverter IVM2 is constituted with a high-resistance type inverter as it was noted above, the output which received low level becomes about 5 V, and high level if 5 V is applied to the input terminal of inverter IVM1.

Namely, the data level which decreased to about 3.5 V due to the substrate effect or threshold voltage $V_{thN}$ of transfer gate NTM1 is compensated and flow of through current is suppressed; thus, the high level is stably maintained.

Next, clock signal MCLK1 becomes low level and when clock signal SCLK is input into gate terminal of transfer gate NTS1 in slave latch SLV at high level, transfer gate NTM1 takes on the OFF state and transfer gate NTS1 takes on the ON state.

By it, high level output of inverter IVM3 in master latch MST passes through transfer gate NTS1 but at this time, as in the case of master latch MST, the level in output terminal side node ND2 of transfer gate NTS1 becomes about 3.5 V due to the substrate effect and threshold voltage $V_{thN}$ of transfer gate NTS1, and this level is applied to the input terminal of inverter IVS1.

The circuit threshold value of inverter IVS1 is set at about 1.2 of power voltage $V_{DD}$ or a level slightly lower than that, as noted above, so the output side becomes low level due to the level inversion function of inverter IVS1. At this time, the input level is 3.5 V which is lower than 5 V so some through current flows.

Low level which is output of inverter IVS1 is applied to the input terminal of inverter IVS3 and inverter IVS2.

Inverter IVS2 is constituted with a high-resistance type inverter, as noted above, the output which received low level becomes about 5 V, and this high level of 5 V is applied to the input terminal of inverter IVS1.

Namely, the data level which dropped to about 3.5 V due to the substrate effect and threshold value voltage $V_{thN}$ of transfer gate NTS1 is compensated, and the flow of through current is suppressed; thus, the level is stably maintained.

Thus, a stabilized high-level output is obtained from inverter IVS3 and output from data output terminal DOUT.

As noted above, the circuit in FIG. 15 is stably operated as a shift register which shifts the data successively with clock signal MCLK and clock signal SCLK under power voltage $V_{DD}$ of 5 V.

However, from the need to reduce power consumption in recent years and to secure reliability in fine ICs, the bottom limit for power voltage $V_{DD}$ of 3.0 V or 2.7 V and depending on the application, a need to secure operation at even lower voltage is being created.

When power voltage $V_{DD}$ is decreased, not only is a considerable decrease in the operational speed of the IC created, but, in shift register circuits, etc., there was the problem of sufficient propagation of a high level not being possible due to said substrate effect or threshold value voltage $V_{thN}$ of the transistor itself when propagating high level in n-channel transfer gates thus the operation became defective.

The level, after propagating through the transfer gate, becomes approximately ($V_{DD}-V_{thN}$) and under low power voltage, the propagated level becomes lower than the decrease in power voltage $V_{DD}$.

The circuit threshold value with inverter receiving this level is set to about ½ of power voltage $V_{DD}$ or a level slightly lower than that under realistic beta ratio in the design so in order to transmit sufficient level over said circuit threshold value to the node after propagating through the transfer gate, it is necessary to decrease the threshold value voltage $V_{thN}$ or raise the gate voltage.

In order to solve this problem, it has been proposed to change the manufacturing process to a process of lowering the threshold value voltage $V_{thN}$ by decreasing, for example, the p-type concentration of n-type channels.

However, the gate length of the transistor in VLSI has reached the area of submicrons in recent years, and sufficient punchthrough pressure resistance cannot be secured when threshold value voltage $V_{thN}$ is decreased too much. Also, even when the transistor is in the OFF state, it is necessary to solve various problems during the mass production such as the so-called subthreshold current due to the short channel effect in which the current flows due to widening of the depletion layer from the drain, etc.

Also, improving the control of loss in the yield created by the above is also a load in the process and even if threshold value voltage $V_{thX(-N, P)}$ is decreased to a realistic value, the situation will become difficult requiring that consideration also be given to the margin with respect to the variance in the manufacture in order to secure power voltage $V_{DD}=2.7$ V in said circuits.

Furthermore, when shrinkage of 65 μm/0.5 μm, etc., are also included in the consideration, the situation becomes even more difficult in the future.

Therefore, with respect to the operational need for power voltage $V_{DD}=$less than 2.7 V, a so-called complete CMOS type shift register is generally known conventionally with a constitution which replaced all n-channel transfer gates NTM1, NTM1n, NTMs, and NTS1 in FIG. 15 with transfer gates CTM1, CTM1n, CTMs, and CTS1 composed of complementary type MOS (CMOS: complementary MOS) in which a decrease in power consumption and enhancement of the speed are possible like that which is shown in FIG. 17.

In this complete CMOS type shift register, along with inputting clock signals MCLK1, MCLKn, and SCANCLK to each gate terminal of N-MOS transistors N1, Nn, and Ns constituting each CMOS transfer gate CTM1, CTM1n, and CTMs of master latch MST, by inputting inverted clock signals XMCLK1, XMCLKn, and XSCANCLK which inverted clock signals MCLK1, MCLKn, and SCANCLK to each gate terminal of P-MOS transistors P1, Pn, and Ps which constitute each CMOS transfer gate CTM1, CTM1n, and CTMs, each transfer gate CTM1, CTM1n, and CTMs are turned ON/OFF.

Similarly, along with inputting clock signal SCLK to the gate terminal of N-MOS transistor NS constituting CMOS transfer gate CTS1 of slave latch SLV, by inputting inverted clock signal XSCLK which inverted clock signal SCLK into the gate terminal of P-MOS transistor PS constituting CMOS transfer gate CTS1, transfer gate CTS1 is turned ON/OFF.

Also, FIGS. 18a–18d show the timing relationship of clock signal MCLK and inverted clock signal XMCLK, the timing relationship of clock signal SCLK and inverted clock signal XSCLK, and the timing relationship between the mutual clock signals.

As shown in FIGS. 18a–18d, the phase of clock signal MCLK and clock signal SCLK or inverted clock signal XMCLK and inverted clock signal XSCLK is displaced by 180°, and moreover, a so-called isolation time IT in which both signals become low level is provided in order to prevent clock skew.

The complete CMOS type shift register with this type of constitution operates stably as a shift register which shifts the data successively with clock signal MCLK and clock signal SCLK even under power voltage $V_{DD}=2.7$ V.

However, a complete CMOS type shift register needs to provide clock signals to N-MOS transistors N1, Nn, Ns, and NS and P-MOS transistors N1, Nn, Ns, and NS which constitute each CMOS transfer gate CTM1, CTM1n, CTMs, and CTS1, and when the input of data increases, a clock count of double the number becomes necessary.

As a result, securing a fixed spacing with respect to the respective transistor and separation with wells become necessary caused by the increase in the layout area due to the wiring and the polarity of the p-channel and n-channel transfer gates being different.

Also, increase in the timing circuit for preventing clock skew or caution with respect to the clock skew of the p-channel and n-channel with enhancement in the speed of the IC becomes unavoidable and causes an increase in area. Also, buffer for p-channel drive also becomes necessary so it leads to an increase in the layout area. In the data bus, etc., the circuit scale of the clock driver increases since arithmetic is executed by selecting from a number of data inputs and, in this type of circuit state, a considerable increase in the layout area is generated.

OBJECT OF THE INVENTION

It is an object of this invention to provide a shift register which can be operated stably not only under normal power voltage but even under low power voltage without making the circuit complex or increasing the layout area.

SUMMARY OF THE INVENTION

In accordance with the invention, a shift register is provided which includes first and second inverters mutually connected in the opposite orientation, a first transfer gate which conducts the input of the first inverter and an input terminal according to the first clock signal applied to the gate terminal, third and fourth inverters mutually connected in the opposite orientation, and a fifth transfer gate which conducts the input of the fourth inverter and a second node according to the second clock signal applied to the gate terminal, and out of the gate terminals of second and third transfer gates, one gate terminal is connected to the input of the first inverter or the input terminal, and the other gate terminal is connected to the gate terminal of the first transfer gate. A first signal with the same logic as the output of the first or second inverter is applied to the first node, and a second signal in which the logic is opposite to that of the first signal is applied to the second node.

In an aspect of the invention, the first, second, third, fourth, and fifth transfer gates may be n-channel MOS transistors.

When the first clock signal becomes a high level, the first transfer gate and one of either the third or second transfer gate takes on the ON state, and input data of high level "1" or low level "0" input into the input terminal passes through the first transfer gate.

If the input data is high level, the signal level on the input side of the first inverter receives the level decreasing function of the substrate effect and threshold value voltage $V_{thN}$ of the first transfer gate and becomes lower than the signal level in the input terminal. The threshold value voltage of the first inverter is generally set at about ½ of power voltage $V_{DD}$ or a value slightly lower than that so if the signal level on the input side of the first inverter is lower than the threshold value voltage of the first inverter, the first inverter cannot logically invert completely and the output of the first inverter becomes unstable. If the output of the first inverter becomes unstable, the second inverter also cannot logically invert completely, and the output of the second inverter also becomes unstable. If so, the problems of not being able to maintain high-level signals and allowing through currents to flow to the first and second inverters are created.

However, in accordance with the invention, the second or third transfer gate with a lower threshold value voltage than the second inverter is in the ON state due to the input data of high level so the input side of the second inverter is connected to the ground through the second and third transfer gates and becomes a stabilized low level. By it, the second inverter and the first inverter become logically inverted completely, the output side of the first inverter becomes stabilized at a low level and the output side of the second inverter becomes stabilized at a high level. This logical state is maintained stably even if the first clock signal becomes low level and the first transfer gate and the third or second transfer gate take on the OFF state.

Next, when the second clock signal becomes high level in a state, for example, of the first signal with the same level (high level) as the output side of the second inverter being applied to the first node, and the second signal with the same level (low level) as the output side of the first inverter being applied to the second node, the fourth and fifth transfer gates take on the ON state. Then, the input side of the third inverter becomes high level and the input side of the fourth inverter becomes low level. At this time, the input side of the third inverter becomes a level lower than the first node by receiving the level decreasing function of the substrate effect and the threshold value voltage of the fourth transfer gate. If this level is a level lower than the threshold value voltage of the third inverter, the third inverter cannot logically invert completely and the output level becomes unstable.

However, the low level which passes through the fifth transfer gate does not receive the level decreasing function of the substrate effect and the threshold value voltage of the fifth transfer gate so the input side of the fourth inverter becomes stabilized at a low level. By this stabilized low level, the fourth inverter and the third inverter are logically inverted completely, the output side of the third inverter becomes stabilized at a low level and the output side of the fourth inverter becomes stabilized at a high level. This logical state is maintained stably even if the second clock signal becomes low level and the fourth and the fifth transfer gates take on the OFF state.

By it, a stabilized output of a high level or a low level is obtained from the shift register.

If the input data is at a low level, the second or third transfer gate does not take on the ON state but the low level which passes through the first transfer gate is maintained with stability since the prescribed level decreasing function of the substrate effect and the threshold value voltage of the first transfer gate are not received, and appears as a stabilized low level on the input side of the first inverter. Consequently, the first inverter and the second inverter logically invert completely and operate stably as a shift register.

BRIEF DESCRIPTION OF THE DRAWINGS

FIG. 1 is circuit diagram showing a first embodiment of a shift register in accordance with the invention.

FIGS. 2a and 2b are tables showing the operational speed on the master latch side when simulation is executed at a power voltage $V_{DD}$=2.7 V for a conventional CMOS type shift register and the shift register of FIG. 1.

FIGS. 3a and 3b are tables showing the operational speed on the slave latch side when simulation is executed at a power voltage $V_{DD}$=2.7 V for a conventional CMOS type shift register and the shift register of FIG. 1.

FIGS. 4a and 4b are tables showing the power consumption within a given transmission time when simulation is executed at a power voltage $V_{DD}$=2.7 V.

FIGS. 5a–5c are tables showing the operational speed on the master latch side of the product of the shift register of FIG. 1 when simulation is executed by changing the power voltage $V_{DD}$ to 1.5 V, 2.7 V, and 4.5 V at temperatures of 85° C., 25° C., and −25° C.

FIGS. 6a–6c are tables showing the operational speed on the slave latch side of the product of the shift register of FIG. 1 when simulation is executed by changing the power voltage $V_{DD}$ to 1.5 V, 2.7 V, and 4.5 V at temperatures of 85° C., 25° C., and –25° C.

FIGS. 7a–7c are tables showing the power consumption of the product of the shift register of FIG. 1 when simulation is executed by changing the power voltage $V_{DD}$ to 1.5 V, 2.7 V, and 4.5 V at temperatures of 85° C., 25° C., and –25° C..

FIG. 17 is a circuit diagram of a conventional complete CMOS type shift register.

FIGS. 18a–18d are timing charts of the first and second clock signals and inverted first and inverted second clock signals of the conventional CMOS type shift register shown in FIG. 17.

Figures 8, 9:
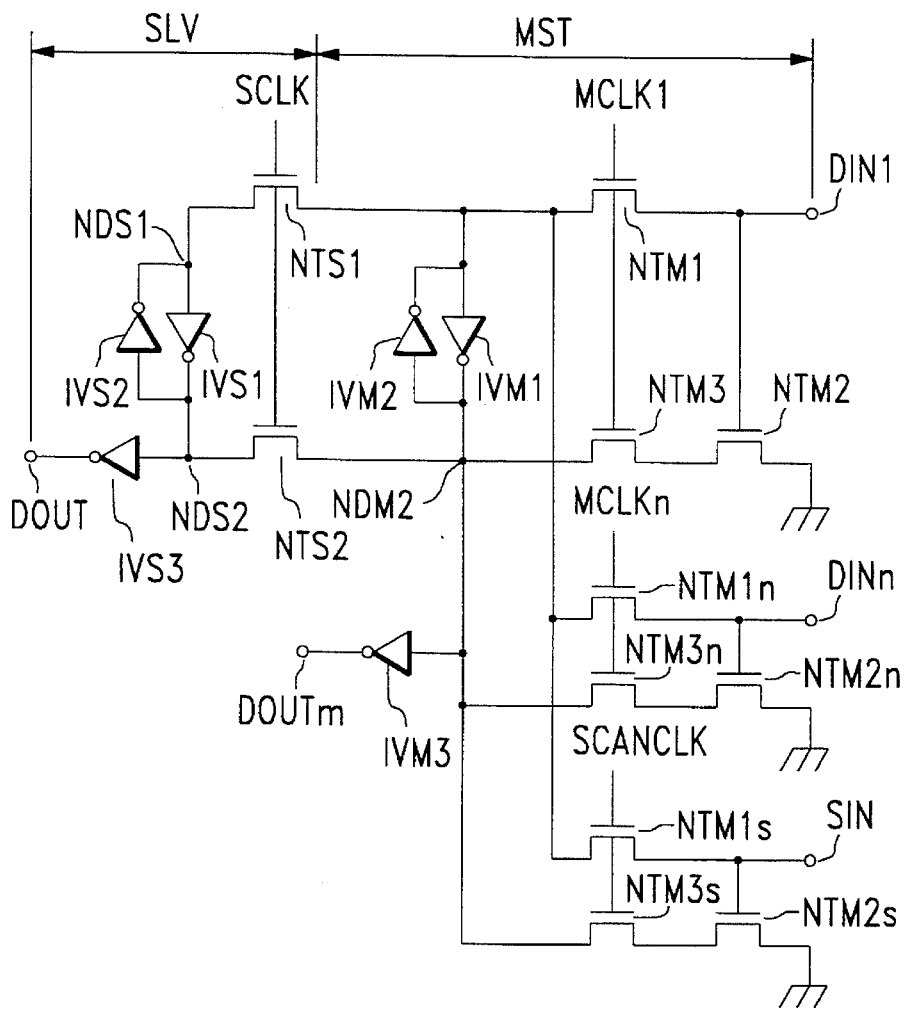
FIG. 8 is a circuit diagram showing a second embodiment of a shift register in accordance with the invention.
FIG. 9 is a table showing comparative examples of the area ratio and size between a conventional CMOS type circuit and the products of the shift registers shown in FIGS. 1 and 8.

In reference symbols and/or numerals as employed in the drawings, MST ... master latch, SLV ... slave latch, NTM1, NTM1n, NTM1s ... transfer gates, NTM2, NTM2n, NTM2s ... transfer gates, NTM3, NTM3n, NTM3s ... transfer gates, NTS1 ... transfer gate, NTS2 ... transfer gate, IVM1, IVM2, IVM4, IVS1, IVS2, IVS3, IVS4 ... inverters, DIN1, DINn, SIN ... data input terminals, DOUT ... data output terminal, MSLK1, MCLKn ... clock signals, SCLK ... clock signal, SCANCLK ... scan clock signal.

DESCRIPTION OF THE PREFERRED EMBODIMENTS

FIG. 1 is a circuit diagram showing a first embodiment of a shift register in accordance with the invention wherein 3 n-channel transfer gates and inverters are employed. MST is a master latch, SLV is a slave latch, NTM1, NTM1n, NTM1s, NTM2, NTM2n, NTM2s, NTM3, NTM3n, NTM3s, NTS1, and NTS2 are transfer gates composed of n-channel MOS transistors with a threshold value voltage $V_{thN}$ of about 1 V, IVM1, IVM2, IVS1, IVS2, and IVS3 are inverters, DIN1, DINn, and SIN are data input terminals, DOUT is the data output terminal, MCLK1 and MCLKn are clock signals, SCLK is the clock signal, and SCANCLK is the scan clock signal.

Master latch MST comprises transfer gates NTM1, NTM1n, NTM2, NTM2n, NTM3, NTM3n, NTM1s, NTM2s, and NTM3s, and inverters IVM1 and IVM2.

Specific connections are that the input terminal of transfer gate NTM1 and gate terminal of transfer gate NTM2 are connected to data input terminal DIN1. The input terminal of transfer gate NTM2 is grounded, and the output terminal is connected to the input terminal of transfer gate NTM3.

Also, inverters IVM1 and IVM2 are connected in parallel by mutually opposing the orientation of the input/output terminals between the output terminal of transfer gate NTM3 and output terminal of transfer gate NTM1.

Inverter IVM2 differs from a conventional approach in that it does not have to be a high-resistance inverter but when reduction in power consumption is considered, it is preferable to use a small transistor such as an SRAM.

Similarly, the input terminal of transfer gate NTM1n and the gate terminal of transfer gate NTM2n are connected to data input terminal DINn. The input terminal of transfer gate NTM2n is grounded and the output terminal is connected to the input terminal of transfer gate NTM3n.

Also, inverters IVM1 and IVM2 are connected in parallel by mutually opposing the orientation of the input/output terminals between the output terminal of transfer gate NTM3n and the output terminal of transfer gate NTM1n.

Furthermore, the input terminal of transfer gate NTM1s and the gate terminal of transfer gate NTM2s are connected to data input terminal SIN. The input terminal of transfer gate NTM2s is grounded and the output terminal is connected to the input terminal of transfer gate NTM3s.

Also, inverters IVM1 and IVM2 are connected in parallel by mutually opposing the orientation of the input/output terminals between the output terminal of transfer gate NTM3s and the output terminal of transfer gate NTM1s.

Slave latch SLV comprises transfer gates NTS1 and NTS2 and inverters IVS1, IVS2, and IVS3.

Specific connections are that the input terminal of transfer gate NTS1 is connected to the output terminals of transfer gate NTM1, NTM1n, and NTM1s of master latch MST, and the input terminal of transfer gate NTS2 is connected to the output terminals of transfer gates NTM3, NTM3n, and NTM3s of master latch MST.

Also, inverters IVS1 and IVS2 are connected in parallel by mutually opposing the orientation of the input/output terminals between the output terminal of transfer gate NTS2 and the output terminal of transfer gate NTS1.

Furthermore, the input terminal of inverter IVS3 is connected at the connection point of the input terminal of inverter IVS2 and output terminal of inverter IVS1, and the output terminal of inverter IVS3 is connected to data output terminal DOUT.

Inverter IVS2 differs from a conventional approach in that it is not necessary for the inverter to be the high-resistance type but when reduction in power consumption is considered as in the above, it is preferable to use a small transistor such as an SRAM.

Also, the gate terminals of transistors NTM1, NTM1n, NTM1s, NTM3, NTM3n, and NTM3s in master latch MST and the gate terminals of transfer gates NTS1 and NTS2 in slave latch SLV are connected to the control system through the respective signal lines not shown in the figures, and clock signals of prescribed level such as 5 V or lower of 2.7 V, 2 V, 1.7 V, etc., in which the timing is controlled by said control system are input.

Specifically, clock signal MCLK1 is input into the gate terminals of transfer gate NTM3 and the gate of transfer gate NTM1 in master latch MST.

Similarly, clock signal MCLKn is input into the gate terminal of transfer gate NTM3n and the gate terminal of transfer gate NTM1n.

Also, scan clock signal SCANCLK for device test is input into the gate terminal of transfer gate NTM3s and gate terminal of transfer gate NTM1s.

Furthermore, clock signals MCLK (1,n), scan clock signals SCANCLK, and clock signals SCLK in which the phase has been 180° dislocated are input into the gate terminal of transfer gate NTS2 and the gate terminal of transfer gate NTS1 in slave latch SLV.

Therefore, the input of the clock signals is controlled so that when transfer gates NTM1, NTM3, NTM1n, and NTM3n or NTM1s and NTM3n of master latch MST are in the ON state, transfer gates NTS1 and NTS2 of slave latch SLV maintain the OFF state, and when transfer gate NTS1 and NTS2 of slave latch SLV are in the ON state, transfer gates NTM1, NTM3, NTM1n, and NTM3n or NTM1s and NTM3s of master latch MST maintain the OFF state.

Next, the operation based on said constitution will be explained by taking a case when data of high level "1" is input at, for example, 2 V in input terminal DIN1 as an example.

High level "1" data of 2 V input to input terminal DIN1 is input into the gate terminal of transfer gate NTM2 and the input terminal of transfer gate NTM1, and transfer gate NTM2 takes on the ON state.

At this time, when clock signals MCLK1 are input respectively into the gate terminal of transfer gate NTM3 and the gate terminal of transfer gate NTM1 at high level of 2 V, transfer gates NTM1 and NTM3 take on the ON state.

By it, the input data of high level 2 V passes through transfer gate NTM1 but at this time, the level in node NDM1 on the output terminal side of transfer gate NTM1 becomes about 1 V or lower due to the substrate effect or threshold value voltage $V_{thN}$ (about 1 V) of transfer gate NTM1 and this level is applied to the input terminal of inverter IVM1.

The circuit threshold value of inverter IVM1 is generally set at about ½ of power voltage $V_{DD}$ or a level slightly lower so at the beginning of the data input, node NDM2 on the output side becomes low level due to the level inversion function of inverter IVM1. Since the input level is lower than 2 V of 1 V or lower, some through current flows but this unstable low level is applied to the input terminal of inverter IVM2, and the output side inverter IVM2 is maintained more or less at a high level although node NDM1 is unstable.

However, at this time, transfer gates NTM2 and NTM3 are in the ON state as noted above so node NDM2 is made mandatorily into the ground level and gradually becomes stabilized low level of 0 V.

This stabilized low level is applied to the input terminal of inverter IVM2 and the output side of inverter IVM2, namely, node NDM1 is maintained at stabilized high level of about 2 V.

Namely, the data level which decreased to about 1 V due to the substrate effect and threshold value voltage $V_{thN}$ of transfer gate NTM1 is compensated, and node NDM1 and node NDM2 are maintained stably at high level and low level respectively.

Next, clock signal MCLK1 becomes low level, clock signal SCLK is input into the gate terminals of transfer gates NTS1 and NTS2 in slave latch SLV at high level, transfer gates NTM1 and NTM3 take on the OFF state, and transfer gates NTS1 and NTS2 take on the ON state. By it, the high level of node NDM1 in master latch MST passes through transfer gate NTS1, and appears in node NDS1 by receiving the prescribed level decreasing function of the substrate effect and threshold value voltage $V_{thN}$ of transfer gate NTS1 at this time, along with stabilized low level of node NDM2 passing through transfer gate NTS2 and appearing in node NDS2 without receiving the prescribed level decreasing function of the substrate effect and threshold value voltage $V_{thN}$ of transfer gate NTS2 at this time.

The low level which appeared in node NDS2 of slave latch SLV is maintained stably since the prescribed level decreasing effect of the substrate effect and threshold value voltage $V_{thN}$ of transfer gate NTS2 is not received. Consequently, node NDS1 also maintains a stabilized high level.

Then, the stabilized low level of node NDS2 is applied to the input terminal of inverter IVS3 and, by it, a stabilized high level output is obtained from inverter IVS3, and output from data output terminal DOUT.

When the input data is a low level, transfer gate NTM2 of master latch MST does not take on the ON state, but a low level which passes through transfer gate NTM1 is maintained stably without receiving the prescribed level decreasing function of the substrate effect and threshold value voltage $V_{thN}$ of transfer gate NTM1 and appears in node NDM1. Thus node NDM2 on the output side of inverter IVM1 is also maintained in a stabilized high level and operates stably as a shift register.

Transmission of data from master latch MST to slave latch SLV is executed by the level of node NDM1 and NDM2 established by inverters IVM1 and IVM2 passing through transfer gates NTS1 and NTS2. Elements which become causes for large loads such as the gate terminals of transistors are not connected to nodes NDM1 and NDM2. Therefore, inverters IVM1 and IVM2 which execute data transmission and establish the level of nodes NDM1 and NDM2 do not need a large drive capacity. Therefore, it is possible to make the size of the transistors comprising inverters IVM1 and IVM2 small. This is effective for reducing the layout area of the shift register.

As noted above, the circuit in FIG. 1 operates stably as a shift register which shifts the data successively with clock signals MCLK1 and clock signals SCLK under power voltage $V_{DD}$ 2 V.

Also the shift register operates stably without any problems under 5 V which is the normal power voltage level.

As explained above, according to the first embodiment of the shift register, it is not necessary to decrease the threshold value voltage $V_{thN}$ of the n-channel transfer gate which becomes a burden in the manufacturing process, and shift registers which are operable at sufficiently low voltage with only a single clock signal for n-channel can be realized.

Also, the shift register of FIG. 1 basically uses 3 n-channel transfer gates on the master latch MST side and the transistor count is increased by one as compared to 2 gates in the conventional complete CMOS type.

However, the slave latch SLV side uses two n-channel transfer gates such that the increase in the transistor count is small in the shift register as a whole.

Furthermore, all the transfer gates may comprise n-channel transistors so separation layers such as wells or separation of the transistors is not necessary; thus, there is an advantage of being suitable for enhanced integration.

Figure 15:
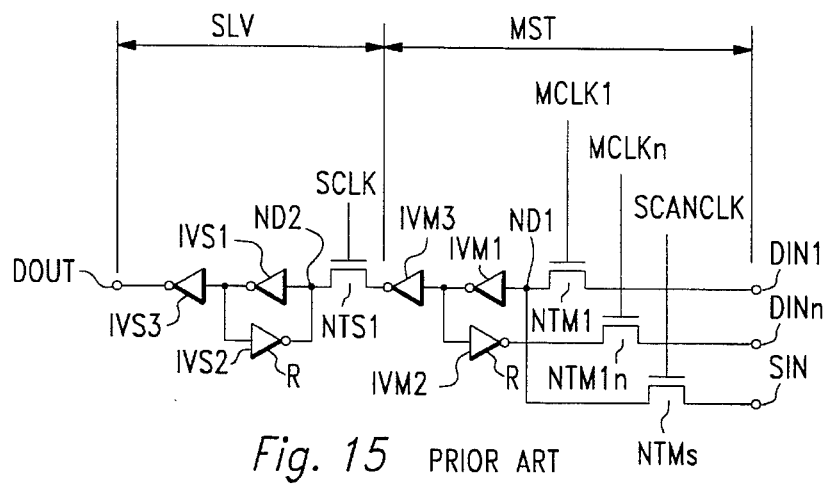
FIG. 15 is a circuit diagram showing the basic constitution of a conventional shift register operable at a power voltage $V_{DD}=5.0$ V.
Figure 16A:
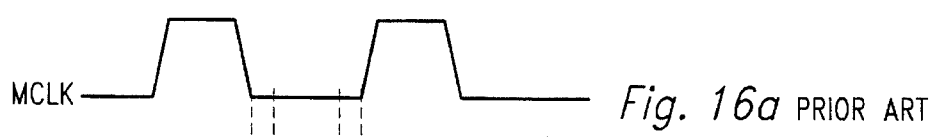
FIGS. 16a and 16b are timing charts of the first and second clock signals of the conventional shift register shown in FIG. 15.
Figure 16B:

In addition, in the case of the conventional 1 transistor/ n-channel transfer gate shown in FIG. 15, the element count is small but in the layout, the periphery becomes the wiring area. There is nothing under the wiring so there is room for arranging transistors. In other words, there is room in the silicon area since the element count is small.

Therefore, there is the advantage of being able to effectively utilize the excess area.

When compared with the complete CMOS type shown in FIG. 17, it is possible to prevent an increase in the circuit scale of the clock driver and an increase in the layout area due to the routing of the clock line by making the number of clocks one with respect to 1 data-in.

Also, the basic operation of the shift register circuit of FIG. 1 maintains operation at low voltage by operating with the ratio circuit by loading low level "0" in node NDM1 when loading low level "0," loading low level "0" in node NDM2 with transfer gate NTM2 during the operation of loading high level "1," and changing the path of the circuit which propagates low level "0" and high level "1."

Therefore, decreasing the operational speed under low voltage can be minimized even in a small transistor size since it is a circuit configuration with an n-channel main body effective for high-speed operation.

Furthermore, in this circuit configuration, it is possible to prevent an increase in load capacity accompanying gate increase since stabilized operation is obtained without providing a gate for leading the node NDS1 or NDS2 into the ground level on slave latch side SLV like transfer gate NTM2 on the master latch MST side. Thus it is possible to prevent a decrease in the operational speed.

FIGS. 2a, 2b, 3a, 3b, 4a, 4b, 5a–5c, 6a–6c, and 7a–7c show operational speed and power consumption when simulation is executed with various power voltages $V_{DD}$ of 4.5 V, 2.7 V, 1.7 V, and 1.5 V using the conventional complete CMOS type shift register and the shift register of FIG. 1. In FIGS. 2a, 3a and 4a show the results of the conventional complete CMOS type shift register.

The temperature for executing the simulation was suitably selected from 85° C., 25° C., and –25° C..

Also, the meaning of each code indicated with "N," "W," "P," "S," and "N" in each figure is that "N" is the n-channel, "W" is Weak, "P" is the p-,channel, "S" is Strong, and "N" is Nominal (center).

For example, "NWPS" indicates a case when n-channel is weak and p-channel is strong and this simulation was executed in 5 types of combinations.

FIGS. 2a and 2b show the operational speed on the master latch side in a case when the simulation was executed at power voltage $V_{DD}$=2.7 V.

As is evident from FIGS. 2a and 2b, the product of the shift register of FIG. 1 can be operated at a speed more or less equal to that of the conventional complete CMOS type.

FIGS. 3a and 3b show the operational speed on the slave latch side in a case when simulation is executed similarly at power voltage $V_{DD}$=2.7 V.

As is evident from FIGS. 3a and 3b, the product of the shift register of FIG. 1 can be operated at a speed more or less equal to that of the conventional complete CMOS type even at the slave side.

FIGS. 4a and 4b show the power consumption within a given transmission time when simulation is similarly executed at power voltage $V_{DD}$=2.7 V.

As is evident from FIGS. 4a and 4b, the product of the shift register of FIG. 1 consumes power more or less equal to or less than the consumption of power by the conventional complete CMOS type.

Also, FIGS. 5a–5c show the operational speed on the master latch side of the product of the shift register of FIG. 1 when simulation is executed by changing power voltage $V_{DD}$ to 1.5 V, 2.7 V, and 4.5 V at temperatures of 85° C., 25° C., and –25° C.

In FIG. 5a, "*" is added to the 25° C. and –25° C. part in "NSPW" but this indicates that it did not operate at temperatures 25° C. and –25° C. when the power voltage $V_{DD}$=1.5 V.

However, it was verified that it operates at favorable speed when the power voltage $V_{DD}$ is raised from 1.5 V to 1.7 V.

As is evident from FIGS. 5a and 5b, the master side of the product of the shift register of FIG. 1 operates at a favorable speed even at low operational voltage.

Also, as is evident from FIG. 5c, the master side of the product of the shift register of FIG. 1 operates at a favorable speed of less than 2 nsec even at normal operational voltage.

FIGS. 6a–6c show the operational speed on the slave latch side of the product of the shift register of FIG. 1 when simulation is executed by changing power voltage $V_{DD}$ to 1.5 V, 2.7 V, and 4.5 V at temperatures of 85° C., 25° C., and –25° C.

As is evident from FIGS. 6a and 6b, even the slave side of the product of the shift register of FIG. 1 operates at a favorable speed even at low operational voltage.

As is evident from FIG. 6c, even the slave side of the product of the shift register of FIG. 1 operates at a favorable speed of below 2 nsec even at normal operational voltage.

Furthermore, FIGS. 7a–7c show the power consumption of the product of the shift register of FIG. 1 when simulation is executed by changing the power voltage $V_{DD}$ to 1.5 V, 2.7 V, and 4.5 V at temperatures of 85° C., 25° C., and –25° C.

In this case, the operational speed becomes slow when the power voltage $V_{DD}$ becomes low so the simulation was executed by changing the machine cycle according to the size of power voltage $V_{DD}$.

As is evident from FIGS. 7a–7c, the product of the shift register in FIG. 1 can obtain a favorable power consumption value.

In the simulations, power voltage $V_{DD}$=1.7 V was the operational threshold value. Of course, there is a decrease in the operational frequency in this area but the function as a shift register is provided sufficiently.

Also, even when compared with the case of a conventional n-channel 1 transistor shown in FIG. 15 at about 3 V, the product of the shift register of FIG. 1 with 3 transistors operates at a higher speed and can be considered a circuit which has a sufficient operational margin on the low voltage side.

Also, there is a possibility for improvement in the operational frequency through optimization of the transistor size and changing the constant of a ratio circuit, and the operable voltage can be decreased if threshold value voltage $V_{thN}$ of the n-channel transistor is decreased further.

FIG. 8 is a circuit diagram showing a second embodiment of a shift register in accordance with the invention.

The second embodiment differs from the first embodiment in that latch data can be output at master latch MST whereas in the first embodiment output is obtained only from slave latch SLV.

Therefore, the input terminal of inverter IVM3 is connected for data output to node NDM2 of master latch MST, and the output terminal of inverter IVM3 is connected to data output terminal DOUTm in the second embodiment.

In other respects, the second embodiment is the same as the first embodiment.

The second embodiment is capable of the same results as those obtained in the first embodiment.

FIG. 9 shows the comparative results of the area ratio and the cell size when constituted as data-in DIN 4 and scan-in SIN 1 in the shift register of FIG. 1 which does not have master output, shift register of FIG. 8 which has master output, and conventional complete CMOS type shift register.

As is evident from FIG. 9, the shift register according to the second embodiment only needs 78% of the area of the conventional complete CMOS type even when it has master output if the complete CMOS type is "1" and only 71% of the area is needed in the shift register of FIG. 1 which does not have master output. Thus, the product of the invention prevents an increase in the layout area.

With regard to the shift register of FIG. 8, a similar simulation to FIGS. 2a, 2b, 3a, 3b, 4a, 4b, 5a–5c, 6a–6c, and 7a–7c was carried out but even in this case, more or less the same favorable results as in the case of the first embodiment were obtained.

Figure 10:
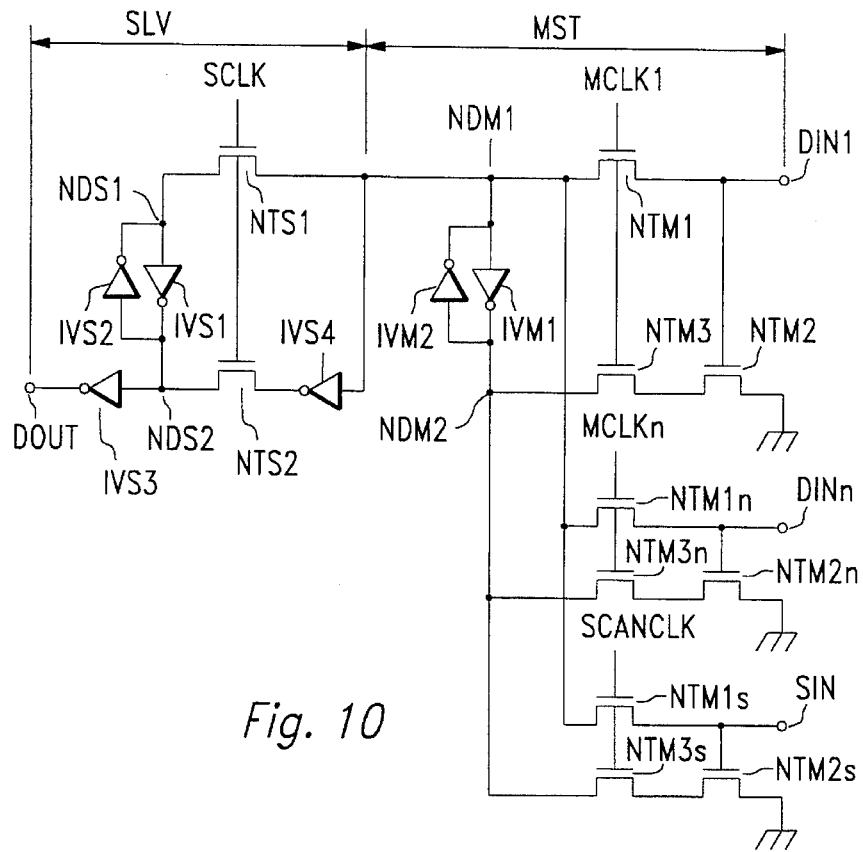
FIG. 10 is a circuit diagram showing a third embodiment of a shift register in accordance with the invention.

FIG. 10 is a circuit diagram showing a third embodiment of a shift register in accordance with the invention.

The third embodiment differs from the first embodiment in that whereas the first embodiment has the input terminal of transfer gate NTS2 connected to node NDM2 connected with output terminal of inverter IVM1 and input terminal of IVM2 in master latch MST, in the third embodiment, the input terminal of transfer gate NTS2 in slave latch SLV is connected to node NDM1 of master latch MST through inverter IVS4.

The third embodiment of the shift register circuit differs from the circuit in the first embodiment by providing for inputting the signals appearing in node NDM1 maintained stably at high level or low level as noted above into slave latch SLV, and inputting signals level inverted in inverter IVS4 into the input terminal of transfer gate NTS2.

With the third embodiment, the same results as those obtained in the first embodiment can be obtained.

Figure 11:
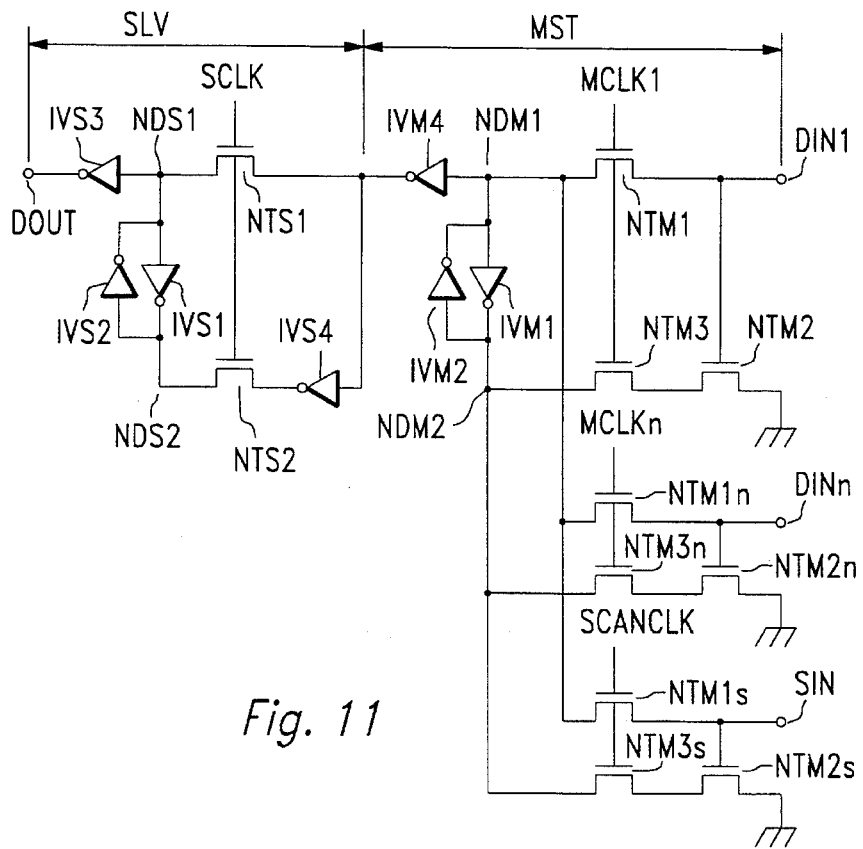
FIG. 11 is a circuit diagram showing a fourth embodiment of a shift register in accordance with the invention.

FIG. 11 is a circuit diagram showing a fourth embodiment of a shift register in accordance with the invention.

The fourth embodiment differs from the third embodiment by having inserted inverter IVM4 between node NDM1 of master latch MST and the connection point of the input terminal of inverter IVS4 and the input terminal of transfer gate NTS1 of slave latch SLV.

As a result, in the fourth embodiment, data output terminal DOUT and inverter IVS3 become the output step to be connected to node NDS1 connected to the output terminal of transfer gate NTS1 instead of node NDS2 connected to the output terminal of transfer gate NTS2 since the input signal level to slave latch SLV inverts from the case of the third embodiment.

Otherwise, the fourth embodiment is the same as the third embodiment.

With the fourth embodiment, the same results as those obtained in the first embodiment can be obtained.

Figure 12:
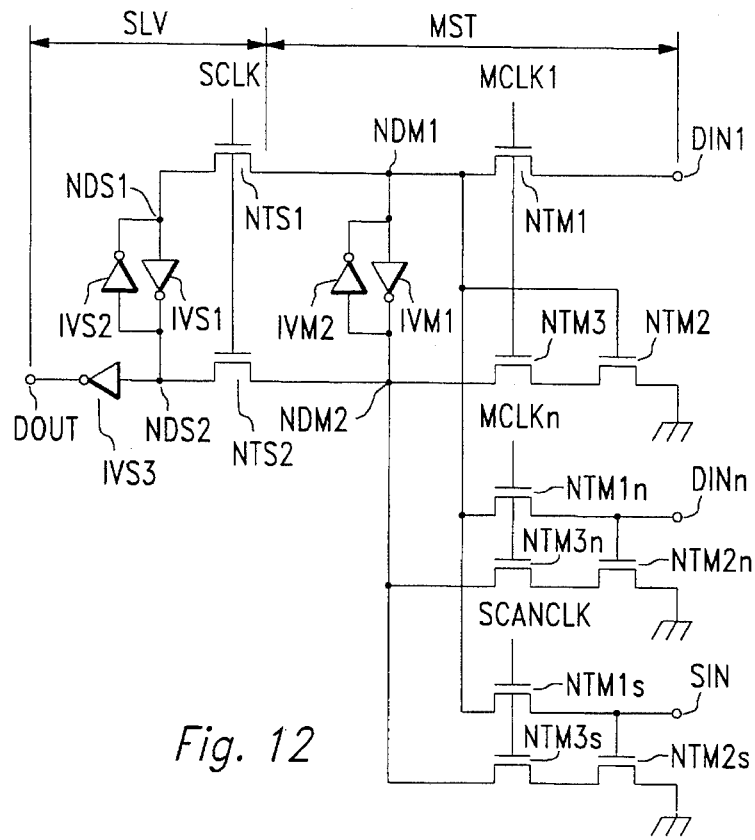
FIG. 12 is a circuit diagram showing a fifth embodiment of a shift register in accordance with the invention.

FIG. 12 is a circuit diagram showing a fifth embodiment of a shift register in accordance with the invention.

The fifth embodiment differs from the first embodiment in that whereas the first embodiment has the gate terminals of transfer gates NTM2, NTM2n and NTM2s connected respectively to data input terminals DIN1, DINn, and SIN, in the fifth embodiment, the gates of each transfer gate NTM2, NTM2n and NTM2s are connected respectively to the output terminals of transfer gates NTM1, NTM1n, and NTM1s.

The fifth embodiment of the shift register circuit differs from the circuit in the first embodiment by placing node NDM2 into the ground level and by providing for each transfer gate NTM2, NTM2n, NTM2s, NTM3, NTM3n, and NTM3s to take on the ON state when high-level signals are input into input terminals DIN1, DINn, and SIN, and clock signals MCLK1 and MCLKn and scan clock signal SCANCLK are input into the gates of transfer gates NTM1, NTM1n, and NTM1s and transfer gates NTM3, NTM3n, and NTM3s.

With the fifth embodiment, the same results as those obtained in the first embodiment can be obtained.

Figure 13:
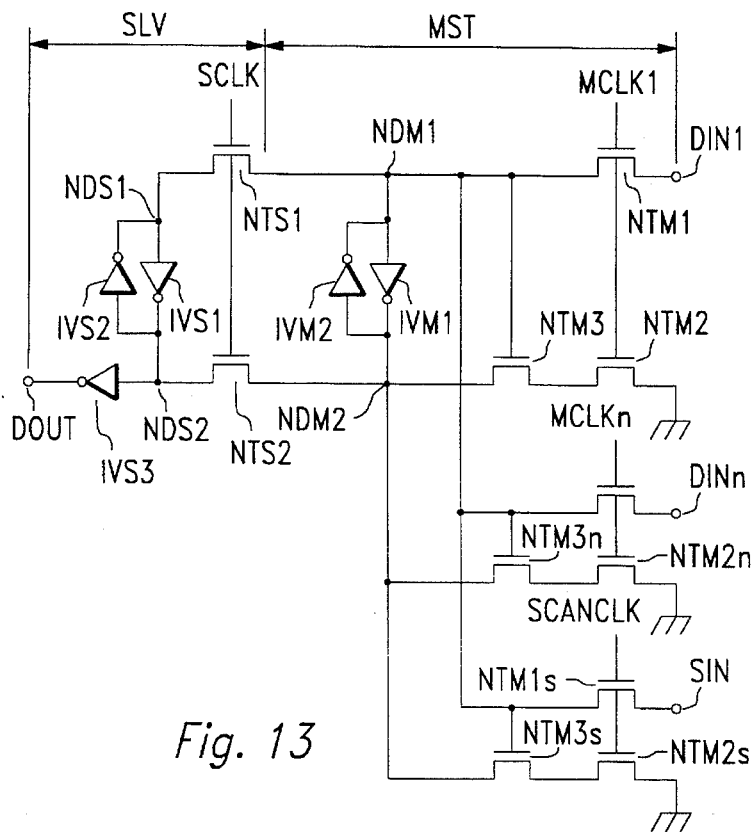
FIG. 13 is a circuit diagram showing a sixth embodiment of a shift register in accordance with the invention.

FIG. 13 is a circuit diagram showing a sixth embodiment of a shift register in accordance with the invention.

The sixth embodiment differs from the fifth embodiment in that whereas the fifth embodiment has the gate terminals of transfer gates NTM1, NTM1n and NTM1s and transfer gates NTM3, NTM3n, and NTM3s connected to the input line of clock signals MCLK1 and MCLKn and scan clock signal SCANCLK, and the gate terminals of transfer gates NTM2, NTM2n, and NTM2s connected to the output terminals of transfer gates NTM1, NTM1n, and NTM1s, the sixth embodiment has the gates of transfer gates NTM1, NTM1n and NTM1s and transfer gates NTM2, NTM2n, and NTM2s connected respectively to the input lines of clock signals MCLK1 and MCLKn and scan clock signal SCANCLK, and the gate terminals of transfer gates NTM3, NTM3n, and NTM3s connected respectively to the output terminals of transfer gates NTM1, NTM1n, and NTM1s.

Otherwise, the sixth embodiment is the same as the fifth embodiment.

With the sixth embodiment, the same results as those obtained in the first embodiment can be obtained.

Figure 14:
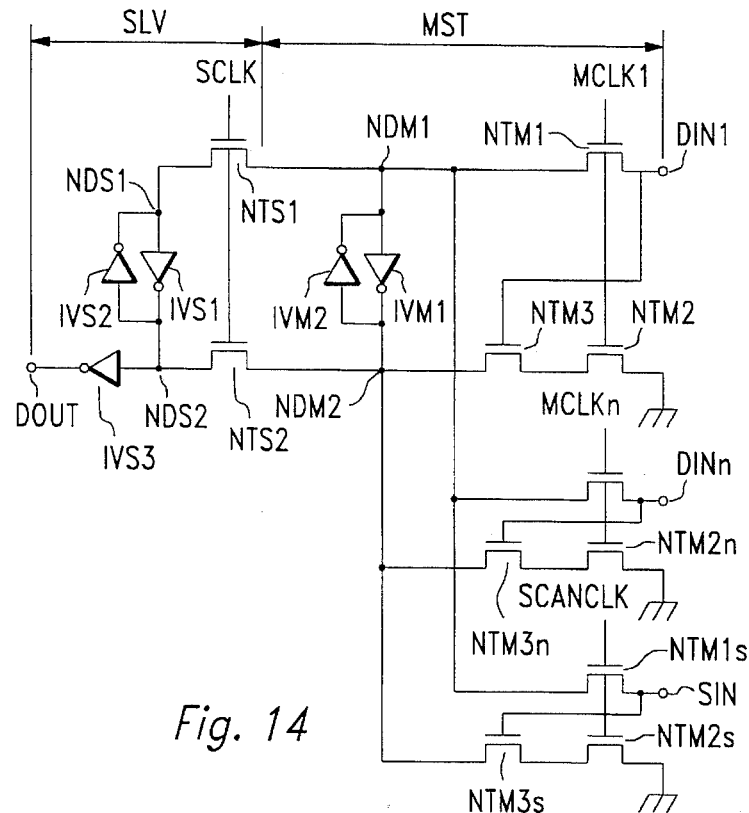
FIG. 14 is a circuit diagram showing a seventh embodiment of a shift register in accordance with the invention.

FIG. 14 is a circuit diagram showing a seventh embodiment of a shift register in accordance with the invention.

The seventh embodiment differs from the sixth embodiment in that the gate terminals of transfer gates NTM3, NTM3n, and NTM3s are respectively connected to data input terminals DIN1, DINn, and SIN instead of the output terminals of transfer gates NTM1, NTM1n, and NTM1s.

Otherwise, the seventh embodiment is the same as the sixth embodiment.

With the seventh embodiment, the same results as those obtained in the first embodiment can be obtained.

In the first embodiment shown in FIG. 1, transfer gates NTM1 and NTM3 can be p-channel MOS transistors. In this case, it is necessary to logically invert clock signals MCLK1 in the operation. Also, it is the same regarding transfer gates NTS1 and NTS2.

Also, in the third embodiment, the input terminal of transfer gate NTS1 and the input terminal of inverter IVS4 can be connected to node NDM2 instead of node NDM1. In this case, the input terminal of inverter IVS3 is connected to node NDS2 instead of node NDS1.

Furthermore, in the fourth embodiment, the input terminal of inverter IVM4 can be connected to node NDM2 instead of node NDM1. In this case, the input terminal of inverter IVS3 is connected to node NDS1 and not node NDS2.

According to the invention, a shift register is provided which can be operated in a stable manner, not only under normal power voltage but even under low power voltage, without a complex circuit or an increase in the layout area.

I claim:

1. A shift register comprising:
   a data input terminal;
   first and second inverters mutually connected in the opposite orientation;

a first transfer gate having an input terminal and an output terminal with a gate terminal interposed therebetween;

the input terminal of said first transfer gate being connected to said data input terminal and the output terminal of said first transfer gate being connected to the input of said first inverter, said first transfer gate being responsive to a first clock signal applied to the gate terminal thereof for receiving data at the input terminal thereof from said data input terminal and outputting data at the output terminal thereof for input to said first inverter;

second and third transfer gates having respective input, output and gate terminals interposed between the input terminal and the output terminal, said second and third transfer gates being connected in series;

the input terminal of said second transfer gate being connected to ground and the output terminal of said third transfer gate being connected to the input of said second inverter;

a first node in the connection between the output terminal of said first transfer gate and the input of said first inverter;

a second node in the connection between the output terminal of said third transfer gate and the input of said second inverter;

said first node receiving a first logic signal having a logic state corresponding to the output of said second inverter;

said second node receiving a second logic signal having a logic state opposite from that of said first logic signal as received at said first node;

third and fourth inverters mutually connected in the opposite orientation;

a fourth transfer gate having an input terminal and an output terminal with a gate terminal interposed therebetween;

the input terminal of said fourth transfer gate being connected to the output terminal of said first transfer gate and to the input of said first inverter, and the output terminal of said fourth transfer gate being connected to the input of said third inverter, said fourth transfer gate being responsive to a second clock signal applied to the gate terminal thereof for receiving data at the input terminal thereof from the output terminal of said first transfer gate and outputting data at the output terminal thereof for input to said third inverter;

a third node in the connection between the output terminal of said fourth transfer gate and the input of said third inverter;

a fifth transfer gate having an input terminal and an output terminal respectively interconnecting the output of the first inverter and the input of the fourth inverter;

a gate terminal of said fifth transfer gate being connected and responsive to said second clock;

a fourth node in the connection between the output terminal of said fifth transfer gate and the input of said fourth inverter;

said third node receiving a third logic signal having a logic state corresponding to the output of said fourth inverter;

said fourth node receiving a fourth logic signal having a logic state opposite from that of said third logic signal as received at said third node;

an output terminal connected to the output terminal of said fifth transfer gate; and said fourth node being disposed in the connection between the output terminal of said fifth transfer gate and said output terminal.

2. A shift register as set forth in claim 1, further including a fifth inverter disposed in the connection between the output terminal of said fifth transfer gate and said output terminal;

said fourth node being located in the connection between said output terminal of said fifth transfer gate and said output terminal on the input side of said fifth inverter.

3. A shift register as set forth in claim 1, wherein the output of said second inverter is connected to said first node and the output of said first inverter is connected to said second node.

4. A shift register as set forth in claim 1, further including an alternate output terminal connected to the output of said first inverter; and said second node being interconnected between said alternate output terminal and the output of said first inverter;

wherein latch output data can be provided at said alternate output terminal in addition to said output terminal.

5. A shift register as set forth in claim 2, further including a sixth inverter having an input connected to the output of said second inverter and having an output connected to the input terminal of said fifth transfer gate; and the input of said sixth inverter also being connected to said first node so as to be interposed in the connection between said first node and said fifth transfer gate.

6. A shift register as set forth in claim 5, further including an additional inverter having its input connected to said first node and having its output connected to the input terminal of said fourth transfer gate and the input of said sixth inverter.

7. A shift register as set forth in claim 1, wherein the gate terminal of said second transfer gate is interconnected in the connection between said data input terminal and the input terminal of said first transfer gate.

8. A shift register as set forth in claim 1, wherein the gate terminal of said second transfer gate is connected to the output terminal of said first transfer gate.

9. A shift register as set forth in claim 1, wherein the gate terminal of said second transfer gate is connected to the gate terminal of said first transfer gate; and the gate terminal of said third transfer gate is connected to the output terminal of said first transfer gate.

10. A shift register as set forth in claim 1, wherein the gate terminal of said second transfer gate is connected to the gate terminal of said first transfer gate; and the gate terminal of said third transfer gate is interconnected in the connection between said data input terminal and the input terminal of said first transfer gate.

* * * * *